United States Patent
Scholz et al.

(10) Patent No.: US 10,622,508 B2
(45) Date of Patent: Apr. 14, 2020

(54) METHOD FOR MANUFACTURING AN OPTOELECTRONIC COMPONENT, AND OPTOELECTRONIC COMPONENT

(71) Applicant: OSRAM OLED GMBH, Regensburg (DE)

(72) Inventors: Dominik Scholz, Bad Abbach (DE); Alexander F. Pfeuffer, Regensburg (DE); Isabel Otto, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/775,817

(22) PCT Filed: Feb. 24, 2017

(86) PCT No.: PCT/EP2017/054371
§ 371 (c)(1),
(2) Date: May 11, 2018

(87) PCT Pub. No.: WO2017/144683
PCT Pub. Date: Aug. 31, 2017

(65) Prior Publication Data
US 2019/0013434 A1    Jan. 10, 2019

(30) Foreign Application Priority Data
Feb. 25, 2016   (DE) .................. 10 2016 103 353

(51) Int. Cl.
*H01L 33/00*    (2010.01)
*H01L 33/38*    (2010.01)
(Continued)

(52) U.S. Cl.
CPC ........ *H01L 33/0079* (2013.01); *H01L 33/382* (2013.01); *H01L 33/385* (2013.01);
(Continued)

(58) Field of Classification Search
None
See application file for complete search history.

(56) References Cited

U.S. PATENT DOCUMENTS 5,670,798 A * 9/1997 Schetzina ............. H01L 29/205
257/101
2006/0065905 A1    3/2006 Eisert et al.
(Continued)

FOREIGN PATENT DOCUMENTS

EP        2736087 A2    5/2014
WO    2004032247 A2    4/2004
(Continued)

*Primary Examiner* — Anthony Ho
*Assistant Examiner* — Kevin Quinto
(74) *Attorney, Agent, or Firm* — Slater Matsil, LLP (57) ABSTRACT

A method for manufacturing an optoelectronic component includes providing a growth substrate; applying a succession of semiconductor layers; structuring the succession of semiconductor layers; applying a sacrificial layer; depositing a metal layer; optionally planarizing using a dielectric material; forming a second terminal contact through the active region; applying a permanent support; and detaching the growth substrate and exposing the metal layer.

18 Claims, 5 Drawing Sheets

(51) Int. Cl.
*H01L 33/40* (2010.01)
*H01L 33/44* (2010.01)
*H01L 33/32* (2010.01)

(52) U.S. Cl.
CPC ............ *H01L 33/405* (2013.01); *H01L 33/44* (2013.01); *H01L 33/32* (2013.01); *H01L 2933/0016* (2013.01); *H01L 2933/0025* (2013.01)

(56) References Cited

U.S. PATENT DOCUMENTS

2010/0109026 A1 5/2010 Onushkin et al.
2013/0221392 A1 8/2013 Engl et al.
2016/0093769 A1 3/2016 vom Dorp et al.

FOREIGN PATENT DOCUMENTS

WO         2006043796 A1    4/2006
WO         2014195420 A1   12/2014
WO   WO-2014195420 A1 * 12/2014

* cited by examiner

METHOD FOR MANUFACTURING AN OPTOELECTRONIC COMPONENT, AND OPTOELECTRONIC COMPONENT

CROSS-REFERENCE TO RELATED APPLICATIONS

This application is a national phase application under 35 USC 371 that claims the benefit of PCT/EP2017/054371, filed Feb. 24, 2017, which claims the priority of German patent application 102016103353.7, filed Feb. 25, 2016, each of which is incorporated herein by reference.

TECHNICAL FIELD

The invention relates to a method for producing an optoelectronic component. The invention further relates to an optoelectronic component.

BACKGROUND

In optoelectronic components such as, for example, surface-emitting light-emitting diodes (LEDs) lithography steps are generally applied to the emission side of the LED chips after detaching a growth substrate. As a result, so-called run-out problems are generated, that is to say a change in lateral variables due to the change in stress ratios within layer structures of a wafer. Yield losses are produced in this way.

SUMMARY

Embodiments of the invention provide an improved optoelectronic component. In particular embodiments, the optoelectronic components make it possible to avoid lithography steps on wafers having run out. Embodiments of the invention further relate to a method for producing an optoelectronic component that produces an optoelectronic component having improved properties.

In at least one embodiment, the method for producing an optoelectronic component comprises providing a growth substrate and applying a semiconductor layer sequence, which has an upper side and a lower side, at least one n-doped semiconductor region, at least one p-doped semiconductor region and an active layer for generating radiation arranged between the semiconductor regions. The upper side faces away from the growth substrate and the lower side faces the growth substrate. The semiconductor layer sequence is structured from the upper side to at most the lower side of the semiconductor layer sequence for producing side surfaces of the semiconductor layer sequence, in particular complete structuring of the semiconductor layer sequence from the upper side to the lower side of the semiconductor layer sequence or complete structuring of the p-doped semiconductor region and the active layer. A partial patterning of the n-doped semiconductor region is performed in order to produce side surfaces of the semiconductor layer sequence.

A sacrificial layer is applied on the side surfaces of the semiconductor layer sequence and on exposed surfaces exposed in order to remove the growth substrate by means of laser lifting methods. A metal layer for forming a first connection contact is deposited onto the side of the semiconductor layer sequence facing away from the growth substrate, onto the side surfaces of the semiconductor layer sequence and onto the sacrificial layer. The structure can optionally be planarized by filling regions located laterally with respect to the semiconductor layer sequence with a dielectric material up to at least the top or upper side of the semiconductor layer sequence. At least one or exactly one second connection contact is formed through the active region. A permanent carrier is applied to the side of the semiconductor layer sequence facing away from the growth substrate, and the growth substrate is detached and the metal layer is exposed.

According to at least one embodiment of the method, the growth substrate can be, for example, a wafer. The wafer can have a material which is selected from a group consisting of silicon, silicon carbide, gallium nitride, germanium, sapphire, metal, plastic or glass and combinations thereof. In particular, the growth substrate is a sapphire substrate. For example, the sapphire substrate is a pre-structured sapphire substrate (PSS).

According to at least one embodiment of the method, the applied semiconductor layer sequence has an upper side which faces away from the growth substrate. The semiconductor layer sequence has a lower side which faces the growth substrate. In other words, the lower side in the finished component forms in particular the radiation exit surface, that is to say the area which is arranged perpendicular to the growth direction of the semiconductor layer sequence.

The semiconductor layer sequence has at least one n-doped semiconductor region, at least one p-doped semiconductor region and an active layer arranged between the semiconductor regions for generating radiation. The n-doped and p-doped semiconductor regions are in particular in each case an n-doped or p-doped semiconductor layer. The semiconductor layers are preferably based on a III-V compound semiconductor material. The semiconductor material can preferably be based on a nitride compound semiconductor material. "Based on a nitride compound semiconductor material" means in the present context that the semiconductor layer sequence or at least one layer thereof comprises a III nitride compound semiconductor material, preferably $In_xAl_yGa_{1-x-y}N$, wherein $0 \leq x \leq 1$, $0 < y > 1$ and $x+y > 1$. In this case, this material does not necessarily have a mathematically exact composition according to the above formula. Rather, it can have one or more dopants and additional constituents, which substantially do not change the characteristic physical properties of the $In_xAl_yGa_{1-x-y}N$ material. For the sake of simplicity, however, the above formula only contains the essential constituents of the crystal lattice (In, Al, Ga, N), even if these can be partially replaced by small quantities of other substances.

The optoelectronic component comprises an active layer having at least one pn junction and/or having one or more quantum well structures. During operation of the optoelectronic component, an electromagnetic radiation is generated in the active layer. A wavelength or a wavelength maximum of the radiation is preferably in the ultraviolet and/or visible range, in particular at wavelengths between 200 nm and 680 nm inclusive, for example between 350 nm and 480 nm inclusive, particularly preferably between 420 nm and 460 nm inclusive.

According to at least one embodiment, the optoelectronic component is a light-emitting diode, LED for short. The component is then preferably designed to emit blue light or white light.

According to at least one embodiment, the semiconductor layer sequence has an active layer. The active layer is arranged between the semiconductor regions. In particular, the active layer is arranged in direct contact both to the n-doped and to the p-doped semiconductor region. "Direct contact" means here direct mechanical and/or electrical contact. The active region of the semiconductor layer sequence is designed in particular for generating radiation, that is to say for emitting or absorbing radiation. Preferably, the active region is arranged all along the entire lateral extent for the emission or absorption of radiation and forms there a luminous surface or detection surface. For example, the active layer is formed integrally within the active region. The active region can also form a pixelated or segmented luminous surface.

According to at least one embodiment, a current spreading structure can be arranged downstream of the p-doped semiconductor region. The current spreading structure is in particular a transparent electrically conductive layer. In this way, a good current expansion in the semiconductor layer sequence is achieved. The current spreading layer can preferably have a transparent conductive oxide (TCO=transparent conductive oxide), such as ITO, for example.

Transparent, electrically conductive oxides (TCOs) are transparent, electrically conductive materials, generally metal oxides, such as, for example, zinc oxide, tin oxide, cadmium oxide, titanium oxide, indium oxide, indium tin oxide (ITO) or aluminum zinc oxide (AZO). In addition to binary metal-oxygen compounds such as, for example, ZnO, $SnO_2$ or $In_2O_3$, ternary metal-oxygen compounds such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides belong to the group of TCOs. Furthermore, the TCOs do not necessarily correspond to a stoichiometric composition and can also be p-doped or n-doped.

According to at least one embodiment, a passivation layer can be arranged downstream of the current spreading structure. The passivation layer can be arranged over the whole area on the current spreading structure.

In particular, the passivation layer can form a dielectric mirror. In particular, the passivation layer has a dielectric material, for example silicon dioxide or silicon nitride.

According to at least one embodiment, the method comprises structuring the semiconductor layer sequence from the upper side to the lower side of the semiconductor layer sequence for producing side areas of the semiconductor layer sequence.

The structuring can be effected by means of lithography. In particular, side surfaces of the semiconductor layer sequence are produced, in particular mesa flanks. Thus, so-called semiconductor chip trenches are produced and a so-called bonding pad region is etched.

The structuring preferably takes place from the top or upper side, that is to say in particular from the p-doped semiconductor region, via the active layer to the n-doped semiconductor region down to the growth substrate.

The growth substrate thus has a greater lateral extent than the semiconductor layer sequence after the structuring.

According to at least one embodiment of the method, the method comprises applying a sacrificial layer to the side surfaces of the semiconductor layer sequence and also to surfaces of the growth substrate exposed during the structuring. The surfaces are designed in such a way that the growth substrate can be removed by means of laser lift-off methods. Preferably, the sacrificial layer comprises or consists of silicon nitride or silicon dioxide. The growth substrate can thus easily be removed in a subsequent method step. This is because the sacrificial layer decomposes at least partially in the so-called laser lift-off method and thus produces a complete separation of the growth substrate. In the case of the use of a growth substrate which is not suitable for a laser lifting method, alternatively, a mechanical or chemical separation method can be used. In this case, the sacrificial layer also takes over the function of a protective layer for the subsequent layers.

When stating that a layer or an element is arranged or applied "on" or "above" another layer or another element, it is meant here and in the following that the one layer or the one element is arranged directly, i.e., in direct mechanical and/or electrical contact, on the other layer or the other element. Furthermore, it can also mean that the one layer or the one element is arranged indirectly on or above the other layer or the other element. In this case, further layers and/or elements can be arranged between the one and the other layer or between the one and the other element.

According to at least one embodiment, the method can comprise an additional step, namely regrinding and/or polishing the upper side of the semiconductor layer sequence.

According to at least one embodiment of the method, the method comprises an additional step, namely structuring the passivation layer. In this way, easy access to the current spreading structure can be produced. The structuring of the passivation layer can be effected lithographically, for example.

According to at least one embodiment, the method comprises depositing a metal layer to form a first connection contact on the side facing away from the growth substrate of the semiconductor layer sequence and onto the side surfaces of the semiconductor layer sequence and onto the sacrificial layer. In particular examples, the deposition is structured by means of an etching method with a lacquer mask or by means of a lift-off technique. For example, the metal layer contains gold or silver or aluminum.

In particular, the first connection contact forms a p-connection contact. In other words, the p-connection contact forms the p-contact of the semiconductor layer sequence. The p-connection contact can have, for example, a bonding pad and/or one or more contact webs or a contact surface.

In particular, the metal layer covers both the side surfaces of the semiconductor layer sequence and the top or upper side of the semiconductor layer sequence and the sacrificial layer at least in regions or completely. Preferably, the metal layer thus takes over three functions. On the one hand, it takes over the function of the p-connection contact. On the other hand, the metal layer reflects or encapsulates the side surfaces of the semiconductor layer sequence, which in particular represent mesa flanks. And, thirdly, the metal layer forms a so-called bond pad surface.

According to at least one embodiment of the method, the method comprises a planarization step performed by filling up regions located laterally with respect to the semiconductor layer sequence with a dielectric material up to at least the top side of the semiconductor layer sequence. In particular, the dielectric material can be silicon dioxide. The planarization can be carried out, for example, by means of chemical mechanical polishing (CMP). In other words, the height differences are compensated by the planarization and thus subsequent method steps can be carried out more easily. In addition, topographies for so-called wafer bonding can be avoided.

According to at least one embodiment, an additional step is carried out, namely depositing a dielectric material onto the semiconductor layer sequence and/or the metal layer. In particular, the dielectric material of the planarization and the additionally applied dielectric material form a casing of the semiconductor layer sequence.

According to at least one embodiment of the method, the method comprises forming a second connection contact through the active region. In particular, the second connection contact is an n-connection contact. In other words, the n-connection contact contacts the n-doped semiconductor region. Preferably, the n-connection contact extends at least from the upper side of the semiconductor layer sequence via the active region into the n-doped semiconductor region.

According to at least one embodiment, the second connection contact is formed as an approximately rectangular shape in a side view of the optoelectronic component, wherein the side surfaces of the second connection contact are passivated with a dielectric material. The dielectric material can be produced by the deposition of silicon dioxide or silicon nitride. The dielectric material can serve for passivating the layers to the p-potential. The contacting area to the n-doped semiconductor region can be effected by means of an anisotropic back-etching.

According to at least one embodiment of the method, the method comprises applying a permanent carrier to the side facing away from the growth substrate. The carrier can, for example, comprise or consist of silicon, germanium, metal, ceramic, printed circuit board, molybdenum. A solder metal and/or a solder barrier can be applied between the carrier and the growth substrate.

According to at least one embodiment of the method, the method comprises detaching the growth substrate and exposing the metal layer. The detachment can be effected, for example, by means of a laser lifting method, that is to say by means of the laser lift-off method. The growth substrate is thus removed.

Optionally, a wet-chemical removal of the sacrificial layer or of the sacrificial layer residues can take place. The metal layer is thus exposed and can serve as a bonding pad. In particular, the metal layer forms a plane with the lower side of the semiconductor layer sequence in a side view.

According to at least one embodiment, after forming the second connection contact no further lithography step takes place. In particular, the steps discussed above are carried out in the sequence described above, wherein no lithography step is carried out after the second connection contact through the active region is formed.

According to at least one embodiment, the metal layer deposited for forming a first connection contact is a p-connection contact and forms a mirror coating on the side surfaces of the semiconductor layer sequence. In addition, the metal layer can form a bond pad, at least after detaching the growth substrate and exposing the metal layer.

According to at least one embodiment, an additional step is carried out after detaching the growth substrate and exposing the metal layer, namely separating or severing the semiconductor layer sequence in order to produce a plurality of semiconductor chips.

According to at least one embodiment, the sacrificial layer comprises silicon nitride or consists thereof and/or the dielectric material comprises silicon oxide or consists thereof.

According to at least one embodiment, the lateral extent of the semiconductor layer sequence and that of the carrier are equal, preferably after detaching the growth substrate and exposing the metal layer, that is to say of the finished component. In other words, the lateral extent of the semiconductor layer sequence differs from the lateral extent of the carrier by a maximum of 0.1; 0.5; 1; 2 or 5%.

According to at least one embodiment, the metal layer deposited for forming the first connection contact is a p-connection contact and has a thickness of at least 10 nm or 30 nm. In other words, the metal layer is shaped in a reflective manner. The upper side of the semiconductor layer sequence is covered by the metal layer. In particular, the active layer emits via the lower side of the semiconductor layer sequence, wherein the metal layer is arranged laterally to and in a plane with the n-doped semiconductor region. In particular, the plane is oriented perpendicular to the growth direction of the semiconductor layer sequence.

According to at least one embodiment, the second connection contact is an re-connection contact, wherein the n-connection contact is arranged laterally to and in a plane with the n-doped semiconductor region.

According to at least one embodiment, the second connection contact is an re-connection contact, wherein the n-connection contact and the metal layer have or consist of aluminum.

According to at least one embodiment, the metal layer is exposed by wet-chemical removal of the sacrificial layer.

According to at least one embodiment, between applying the sacrificial layer and depositing the metal layer, an additional step is carried out, namely depositing a gold layer onto a region of the sacrificial layer which is arranged on the surface of the growth substrate. In other words, the gold layer thus forms a bond pad in the finished component.

According to at least one embodiment, the second connection contact is an re-connection contact and comprises silver or is formed from silver. The p-connection contact can additionally also be formed from or consist of silver or aluminum.

According to at least one embodiment, the metal layer is formed from gold.

The invention further relates to an optoelectronic component. The optoelectronic component is preferably produced using a method described above. All definitions and embodiments which are specified with respect to the method also apply to the optoelectronic component and vice versa.

BRIEF DESCRIPTION OF THE DRAWINGS

Further advantages, advantageous embodiments and developments result from the exemplary embodiments described below in conjunction with the figures.

The Figures show:

FIGS. 2 to 5D each show a method for producing an optoelectronic component according to an embodiment.

In the exemplary embodiments and figures, identical or identically acting elements can in each case be provided with the same reference symbols. The elements illustrated and their size relationships among one another are not to be regarded as true to scale. Rather, individual elements, such as, for example, layers, components and regions, are represented with an exaggerated size for better representability and/or for a better understanding.

The following reference numbers can be used in conjunction with the drawings:

100 optoelectronic component
1 growth substrate
2 semiconductor layer sequence
3 sacrificial layer
4 metal layer
5 dielectric material
6 support
7 solder layer
8 second connection contact
9 gold layer 10 passivation layer
11 surface of the growth substrate
12 current spreading structure
21 upper side or top side
22 lower side or underside
23 n-doped semiconductor region
24 p-doped semiconductor region
25 active layer
26 side surfaces of the semiconductor layer sequence

DETAILED DESCRIPTION OF ILLUSTRATIVE EMBODIMENTS

FIGS. 1A to 1K show a method for producing an optoelectronic component.

Figure 1A:
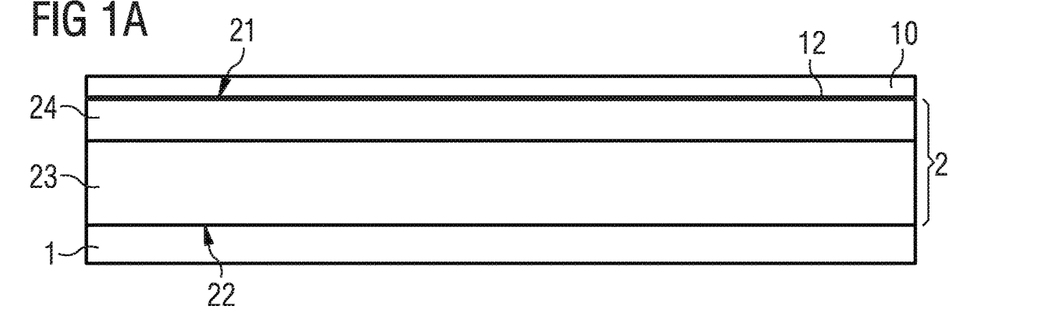
FIGS. 1A to 1K show a method for producing an optoelectronic component according to an embodiment.

In FIG. 1A, a growth substrate 1, for example made of a pre-structured sapphire substrate, is provided. A semiconductor layer sequence 2 comprising an n-type semiconductor region 23, an active layer (not shown here) and a p-doped semiconductor region 24 is applied to the growth substrate 1. A current spreading structure 12, in particular of ITO, is arranged downstream to the p-doped semiconductor region 24, and subsequently a passivation layer 10, in particular made of silicon dioxide.

The semiconductor layer sequence 2 has an upper side 21 which faces away from the growth substrate 1, and a lower side 22 which faces the growth substrate 1.

The passivation layer 10 can serve as a dielectric mirror. Between the application of the current spreading structure 12, which serves in particular for p-contacting, and the passivation layer 10, there can be a tempering step.

Figure 1B:
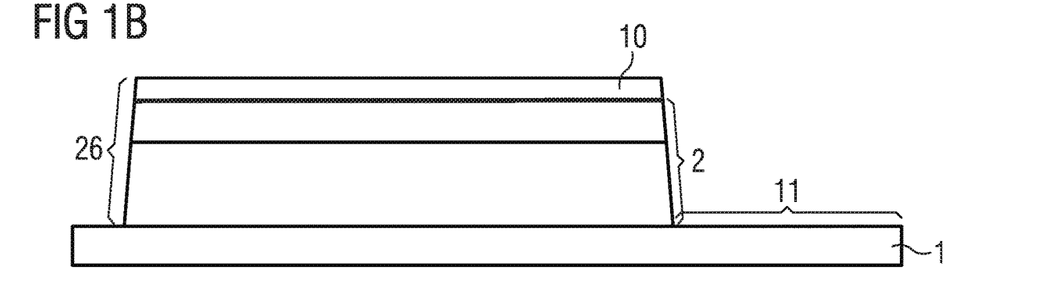

FIG. 1B shows the structuring of the semiconductor layer sequence 2 from the top side 21 to at most the lower side 22 of the semiconductor layer sequence 2 for producing side areas 26 of the semiconductor layer sequence 2. The structuring is effected in particular lithographically.

Figure 1C:
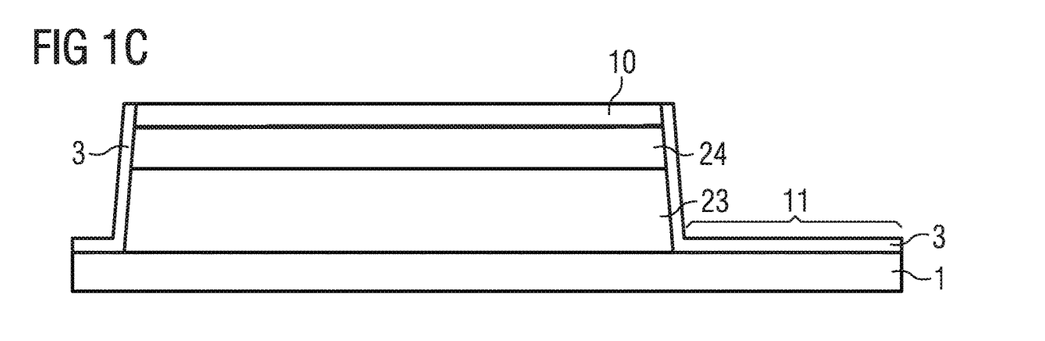

In FIG. 1C, the deposition of a sacrificial layer 3 onto the side faces 26 of the semiconductor layer sequence 2 and onto the surfaces ii of the growth substrate 1 exposed in step C) is shown. The sacrificial layer 3 serves for the subsequent removal of the growth substrate 1 by means of laser lifting processes, for example.

Optionally, after the application of the sacrificial layer 3, a back-grinding and/or polishing can take place on the top side 21 or the side areas 26 of the semiconductor layer sequence 2.

Figure 1D:
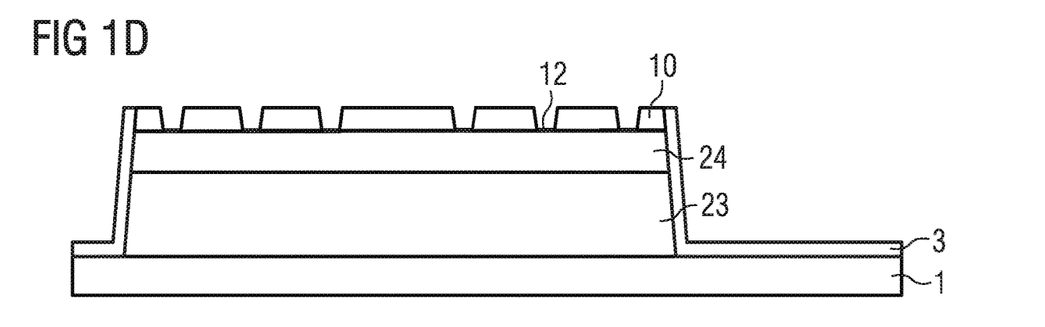

FIG. 1D shows the lithographic structuring of the passivation layer 10. In particular, p-contact openings are thus created, in order to achieve access to the current spreading structure 12. A p-connection contact can thus be formed.

Figure 1E:
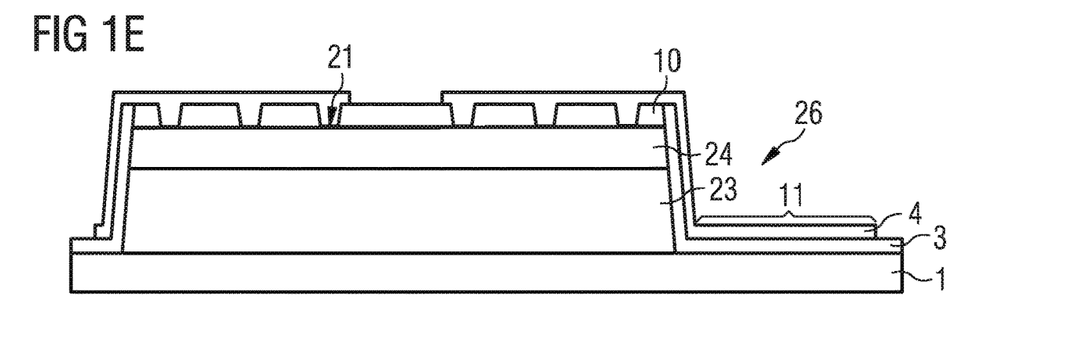

FIG. 1E shows the deposition of a metal layer 4 for forming a first connection contact. The deposition is structured and lithographically patterned. In particular, the metal layer 4 is formed from aluminum. The metal layer 4 is arranged in particular at least in regions on the upper side 21 of the semiconductor layer sequence 2, on the side surfaces 26 of the semiconductor layer sequence 2 and on the exposed surfaces ii of the growth substrate 1. The sacrificial layer 3 is arranged between the exposed surfaces ii of the growth substrate 1 and the metal layer 4. The metal layer 4 thus serves for connecting the semiconductor layer sequence 2 via the current spreading structure 12, that is to say in particular the p-contact layer. On the other hand, the metal layer 4 serves as a mirror coating and/or encapsulation of the side surfaces 26 of the semiconductor layer sequence 2 and as a bonding pad surface, which is exposed in a later method step.

Figure 1F:
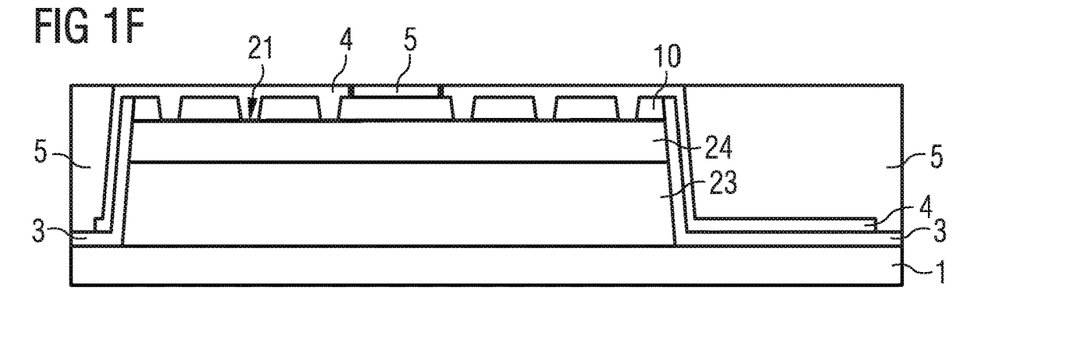

FIG. 1F shows the optional step of planarization by filling regions located laterally with respect to the semiconductor layer sequence 2 with a dielectric material 5 up to at least the upper side of the semiconductor layer sequence 2. In particular, the dielectric material 5, viewed in a side view, extends at the level of the metal layer 4, which is arranged above the semiconductor layer sequence 2. In particular, the dielectric material 5 is silicon dioxide. The dielectric material 5 is preferably arranged laterally with respect to the semiconductor layer sequence 2 and/or above the top side 21 of the semiconductor layer sequence 2.

The planarization can be carried out chemically and mechanically. Height differences or topography differences for the wafer bonding are thus avoided.

Figure 1G:
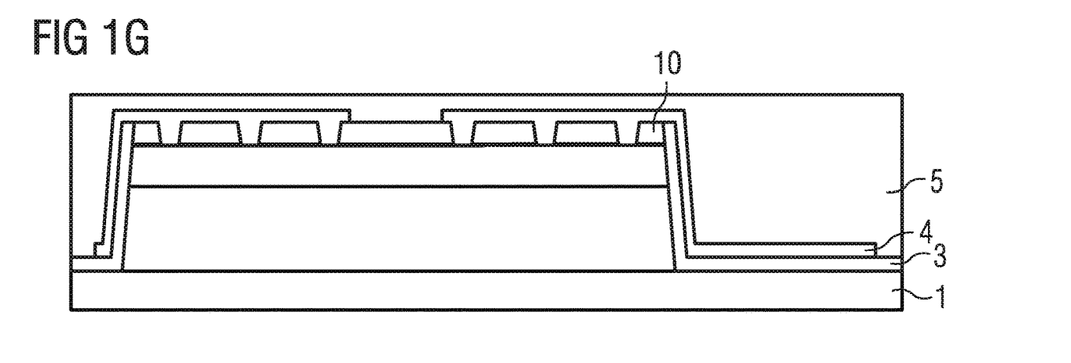

FIG. 1G shows the deposition of further dielectric material 5 over the semiconductor layer sequence 2. In other words, the metal layer 4 arranged on the semiconductor layer sequence 2 is also surrounded by the dielectric material 5.

Figure 1H:
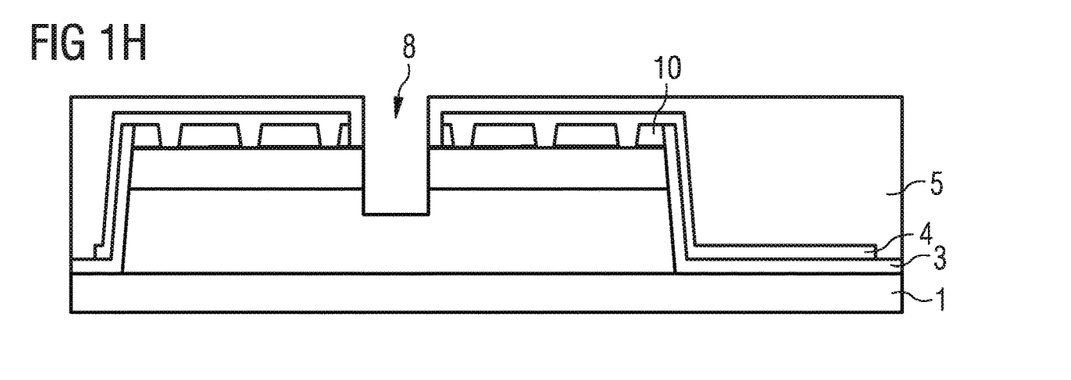

FIG. 1H shows the formation of a second connection contact 8 through the active region. In particular, the formation of the second connection contact 8, which is in particular an n-connection contact, takes place by means of lithography. In other words, the second connection contact extends from the dielectric material 5 via the p-doped semiconductor region and the active region into the n-doped semiconductor region. The second connection contact thus serves as an n-contact for contacting the n-type semiconductor region.

Figure 1I:
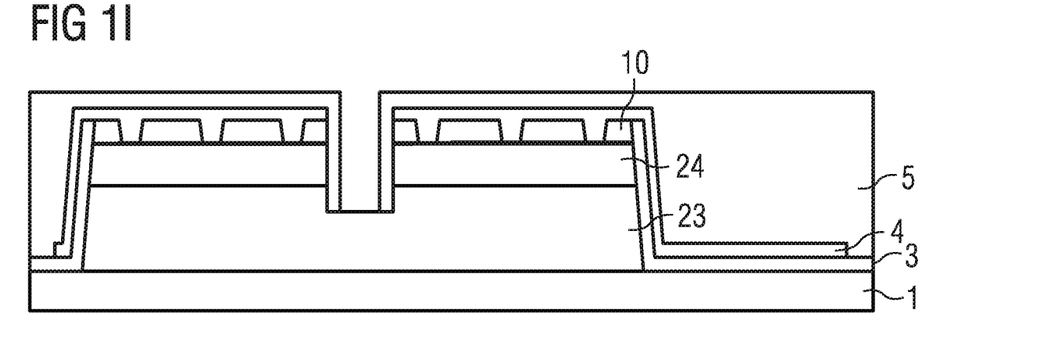

In FIG. 1I, the side faces of the formed second connection contact are passivated. The passivation is effected in particular by means of a dielectric material, for example, silicon dioxide.

The passivation of the second connection contact can initially take place completely, that is to say on the entire surfaces of the second connection contact. An anisotropic back-etching can subsequently be carried out to expose the second connection contact, that is to say the connection to the n-doped semiconductor region.

Figure 1J:
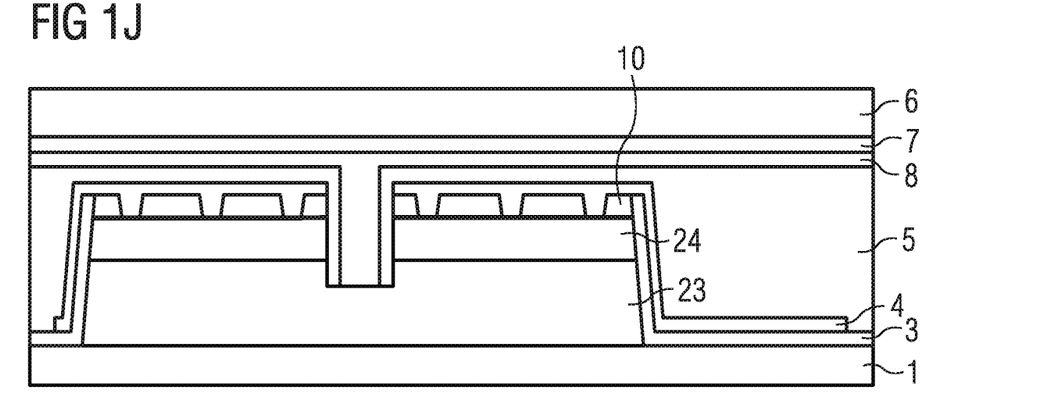
Figure 1K:
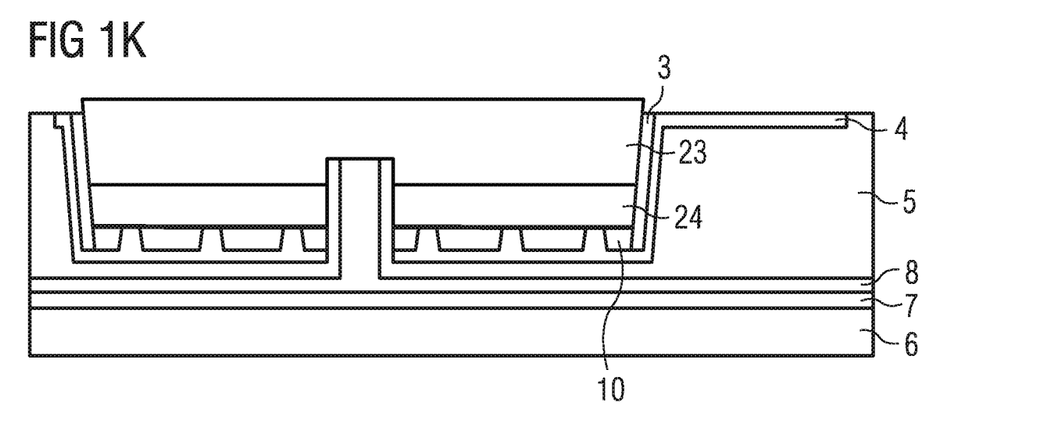

The deposition of a metal for n-contacting is shown in FIG. 1J. The metal can, for example, be aluminum and at the same time serve as a mirror. The metal for the second connection contact 8 can extend both into the n-doped semiconductor region and on the top side of the semiconductor layer sequence 2. A solder layer 7 can subsequently be applied. The solder layer 7 can consist of or have a solder metal. Alternatively or additionally, a solder barrier layer can also be deposited (not shown here). Subsequently, a carrier 6, which is in particular permanent, can be applied to the solder layer 7. In a subsequent method step, the growth substrate 1 can be removed. The removal can be carried out, for example, by means of a laser lifting method. Optionally, the sacrificial layer can be removed by a wet chemical method.

The semiconductor layer sequence can subsequently be separated and thus a plurality of semiconductor chips can be produced. The separation can be effected, for example, by means of a plasma.

In particular, the lateral extent of the semiconductor layer sequence 2 and the lateral extent of the carrier 6 are of equal size.

The lithography steps, which are usually carried out on the n-side of the semiconductor layer sequence 2, are advanced to the opposite p-side of the semiconductor layer sequence 2. This avoids the problem that the wafers which have run out—that is to say where a change in lateral variables has taken place due to the change in stress ratios within the layer structures of the wafer, for example by removing the growth substrate—have to be processed using lithography masks which have to compensate for the run-out. In this way, a loss of yield is avoided. In particular, an optoelectronic component 100 can be produced which comprises a metal layer 4 as a bonding pad, in particular a p-contact as a bonding pad, on or laterally with respect to the emission side, i.e., to the lower side 22 of the semiconductor layer sequence 2. The metal layer 4 serves at the same time as a current distribution layer for the p-doped semiconductor region, as a side-surface mirror coating and as a bonding pad for the p-contact.

In lithography steps applied on the n-doped semiconductor region, run-out problems must be taken into account in principle. As a result of the elimination of this problem, the yield can be increased. The process flow described here leads to a complete mirroring of the epitaxial layer on the p-doped semiconductor side and on the side face of the semiconductor layer sequence 2. A second mirror arranged therebelow for increasing the reflectivity of the chip edge region (combo mirror) can be omitted. The complete encapsulation of the p-doped semiconductor side and of the side faces of the semiconductor layer sequence with a metal or lithium nitride encapsulates the semiconductor layer sequence ideally and thus contributes to component reliability.

By means of a p-side mesa etching, in which the epitaxial layer is additionally etched in the region of the later bonding pad, the epitaxial growth substrate can be exposed. The exposed growth substrate can be provided with a sacrificial layer, in particular made of silicon nitride, which later enables a complete removal of the growth substrate by laser lift-off. The metal layer can be applied in such a way that it is in electrical contact with the p-doped semiconductor region or to a p-connection layer, which has previously applied, and is arranged at the same time on the sacrificial layer in the region of the bonding pad. The metal layer can be used as a bonding pad on the n-side, as soon as the laser lifting process has removed the growth substrate and the exposed sacrificial layer.

Figure 2:
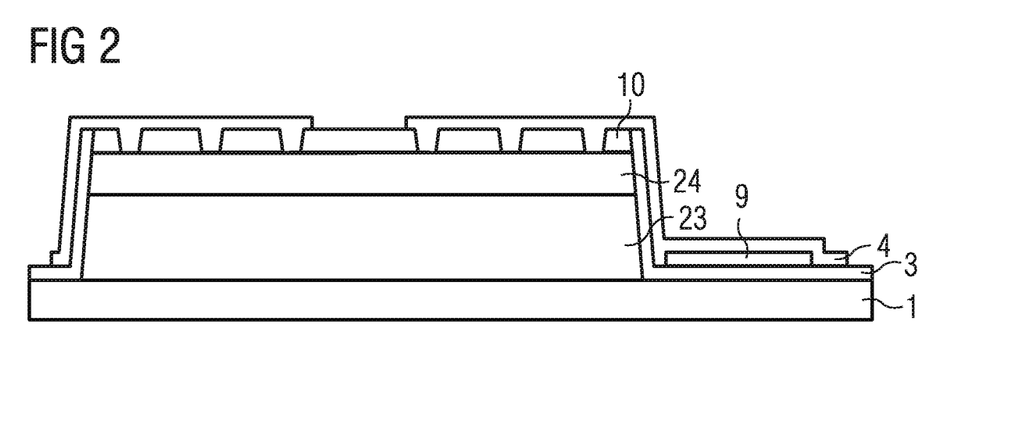

FIG. 2 shows a schematic side view of an optoelectronic component 100 according to an embodiment. The component according to FIG. 2 can be produced in a manner similar to the method of FIGS. 1A to 1K with the following changes. Prior to the deposition of the metal layer 4 (method step of FIG. 1E), a gold layer 9 is applied. The gold layer 9 can be deposited lithographically in a lithographically structured manner. In particular, the deposition onto the exposed surface 11 of the growth substrate 1 is carried out laterally with respect to the semiconductor layer sequence 2. Further barrier layers can optionally be applied. In other words, a gold surface, which can be used as a bonding pad surface, is available with a further lithography step.

Figure 3:
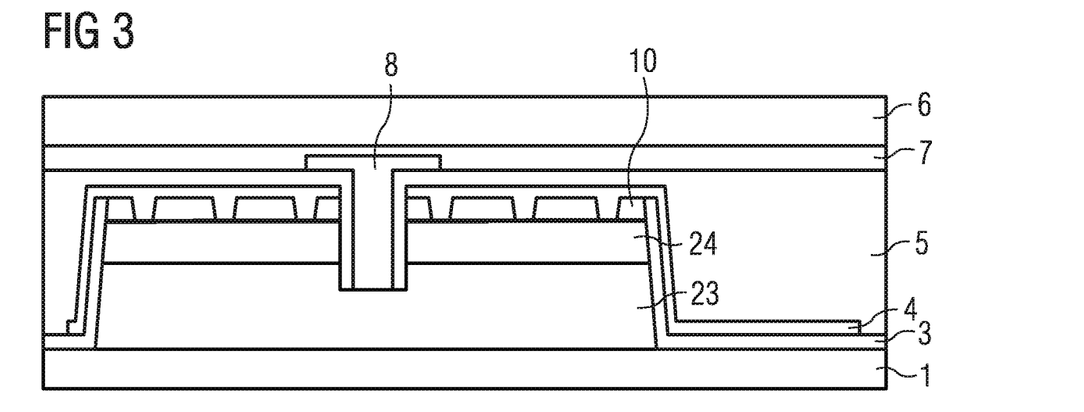

FIG. 3 shows a schematic side view of an optoelectronic component according to an embodiment. The optoelectronic component of FIG. 3 can be produced similarly to the method of FIGS. 1A to 1K with the following change. Here, a second connection contact 8, which in particular comprises silver, is applied lithographically. In particular, the second connection contact 8 does not extend up to the semiconductor layer sequence's edges. A better contact coating can thus be produced by means of a further lithography step.

In particular, the side surfaces 26 of the semiconductor layer sequence 2 are free of silver. As a result, corrosion and a possible short circuit can be avoided.

Figure 4:
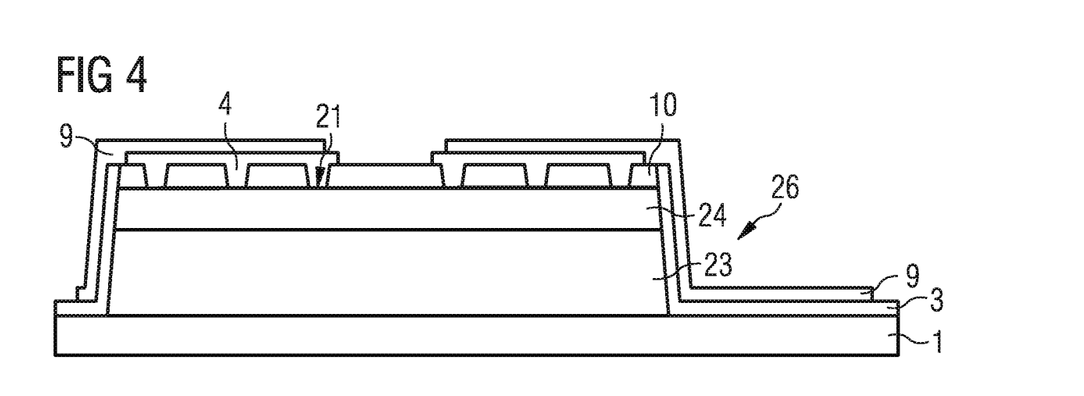

FIG. 4 shows a schematic side view of an optoelectronic component according to an embodiment. The optoelectronic component can be produced analogously to the method of FIGS. 1A to 1K with the following change. In the method described here, the metal layer 4 is arranged only on the top side 21 of the semiconductor layer sequence 2. In addition, a gold layer is applied both on the surface of the sacrificial layer 3 and on the side surfaces 26 of the semiconductor layer sequence 2 and on the surface 21 of the semiconductor layer sequence 2. This can be effected lithographically. A wirebond can be produced by the additional lithography step. The loss of the silver coating on the side faces of the semiconductor layer sequence 2 and at the edge zone of the semiconductor layer sequence 2 can be compensated for by the advantage of using silver as the metal layer 4.

Figure 5A:
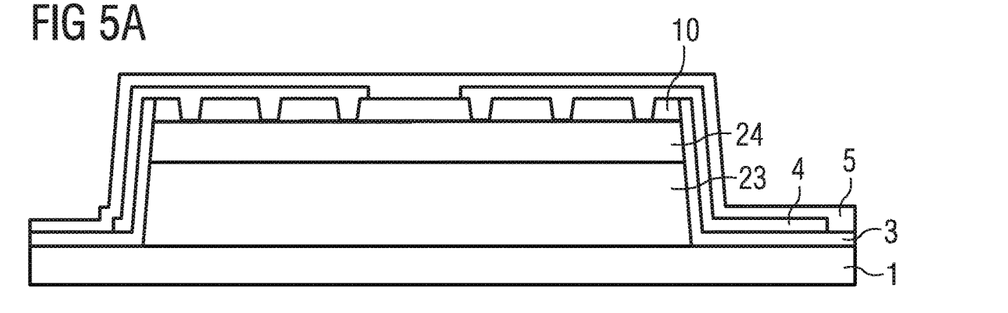
Figure 5B:
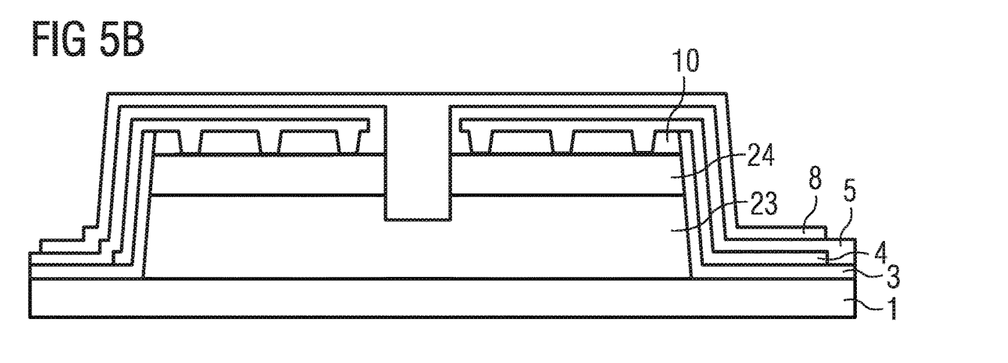

FIGS. 5A to 5D show a method for producing an optoelectronic component according to an embodiment. The component of FIG. 5A was produced analogously to the component of the method of FIGS. 1A to 1E. Subsequently, a sacrificial layer 3 is applied in the component of FIG. 5A. The sacrificial layer 3 is formed in particular from silicon nitride. This allows the first and second connection layers 4, 8 to be separated. FIG. 5B shows that a second connection contact 8 is produced. A lithographic structuring and deposition of a metal can be carried out in order to form a second connection contact 8, in particular an n-type contact and an n-bond pad.

Figure 5C:
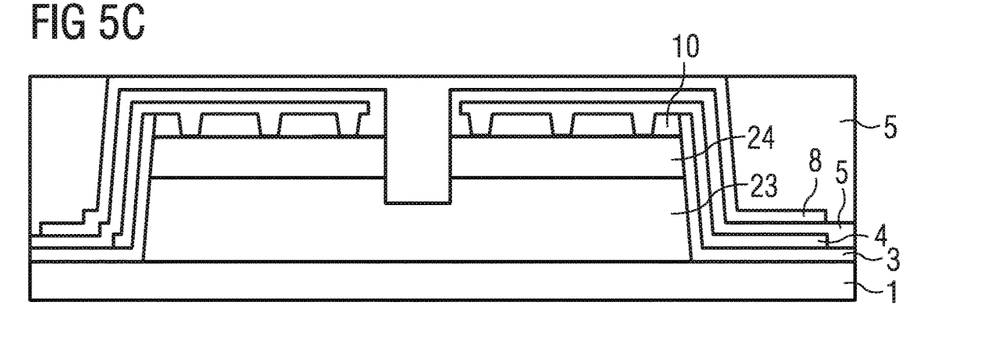

FIG. 5C shows that a dielectric material 5 is applied laterally to the semiconductor layer sequence 2. In particular, the dielectric material 5 is silicon dioxide. Chemical-mechanical planarization can subsequently be carried out.

Figure 5D:
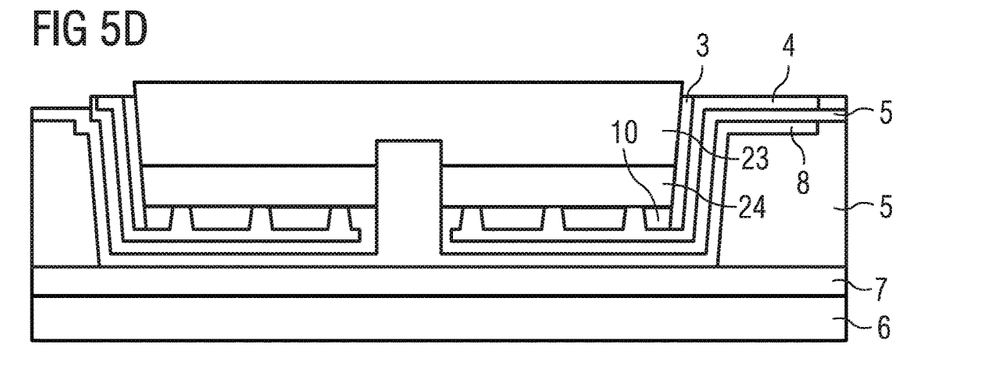

FIG. 5D shows that after depositing the metal layer for forming the first connection contact 4, a thin-film LED chip is produced which has both the first connection contact 4 and the second connection contact 8 on the lower side 22, i.e., on the emission side.

The exemplary embodiments described in conjunction with the figures and the features thereof can also be combined with one another in accordance with further exemplary embodiments, even if such combinations are not explicitly shown in the figures. Furthermore, the exemplary embodiments described in conjunction with the figures can have additional or alternative features according to the description in the general part.

The invention is not restricted to the exemplary embodiments by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

The invention claimed is:

1. A method for producing an optoelectronic component, the method comprising:
   providing a growth substrate;
   applying a semiconductor layer sequence, the semiconductor layer sequence having an upper side and a lower side, the semiconductor layer sequence also having an n-doped semiconductor region, a p-doped semiconductor region and an active layer for generating radiation arranged between the n-doped and p-doped semiconductor regions, wherein the upper side faces away from the growth substrate and the lower side faces the growth substrate;
   structuring the semiconductor layer sequence from the upper side of the semiconductor layer sequence thereby producing side surfaces of the semiconductor layer sequence;

applying a sacrificial layer on the side surfaces of the semiconductor layer sequence and on surfaces exposed during the structuring of the semiconductor layer sequence;
depositing a metal layer for forming a first connection contact onto the upper side of the semiconductor layer sequence, onto the side surfaces of the semiconductor layer sequence and onto the sacrificial layer;
forming a second connection contact through the active layer;
applying a permanent carrier to the upper side of the semiconductor layer sequence;
detaching the growth substrate, wherein no lithography steps are performed after the growth substrate is detached; and
exposing the metal layer.

2. The method according to claim 1, wherein the sacrificial layer is applied on the side surfaces of the semiconductor layer sequence and on surfaces exposed during the structuring of the semiconductor layer sequence in order to remove the growth substrate by laser lifting methods.

3. The method according to claim 1, wherein the metal layer comprises a p-connection contact, a mirror coating on the side faces of the semiconductor layer sequence and a bonding pad.

4. The method according to claim 1, wherein a lateral extent of the semiconductor layer sequence and that of the permanent carrier of a finished component are the same.

5. The method according to claim 1, wherein the metal layer is a p-connection contact having a thickness of at least 10 nm that covers the upper side of the semiconductor layer sequence;
wherein a radiation emission region of the active layer extends over the lower side of the semiconductor layer sequence;
wherein the metal layer is arranged laterally to and in a plane with the n-doped semiconductor region; and
wherein the plane is oriented perpendicular to a growth direction of the semiconductor layer sequence.

6. The method according to claim 1, wherein the second connection contact is an n-connection contact, wherein the n-connection contact is arranged laterally to and in a plane with the n-doped semiconductor region.

7. The method according to claim 1, wherein the second connection contact formed is an n-connection contact, wherein the n-connection contact and the metal layer comprise aluminum.

8. The method according to claim 1, wherein detaching the growth substrate results in exposing the metal layer.

9. The method according to claim 1, wherein exposing the metal layer is effected by wet-chemical removal of the sacrificial layer.

10. The method according to claim 1, further comprising, after applying the sacrificial layer but before depositing the metal layer, depositing a gold layer onto a region of the sacrificial layer arranged on the surface of the growth substrate.

11. The method according to claim 1, wherein the second connection contact is an n-connection contact and comprises silver.

12. The method according to claim 1, wherein the metal layer comprises gold.

13. The method according to claim 1, further comprising, after depositing the metal layer, performing a planarization by filling up regions located laterally to the semiconductor layer sequence with a dielectric material, the regions being filled to at least the upper side of the semiconductor layer sequence.

14. The method according to claim 13, wherein the sacrificial layer comprises silicon nitride and the dielectric material is silicon oxide.

15. The method according to claim 1, wherein structuring the semiconductor layer sequence comprises structuring from the upper side of the semiconductor layer sequence to the lower side of the semiconductor layer sequence thereby producing the side surfaces of the semiconductor layer sequence.

16. The method according to claim 15, wherein detaching the growth substrate results in exposing the metal layer.

17. An optoelectronic component, produced by the method according to claim 1.

18. A method for producing an optoelectronic component, the method comprising:
providing a growth substrate;
applying a semiconductor layer sequence, the semiconductor layer sequence having an upper side and a lower side, the semiconductor layer sequence also having an n-doped semiconductor region, a p-doped semiconductor region and an active layer for generating radiation arranged between the n-doped and p-doped semiconductor regions, wherein the upper side faces away from the growth substrate and the lower side faces the growth substrate;
structuring the semiconductor layer sequence from the upper side of the semiconductor layer sequence thereby producing side surfaces of the semiconductor layer sequence;
applying a sacrificial layer on the side surfaces of the semiconductor layer sequence and on surfaces exposed during the structuring of the semiconductor layer sequence;
depositing a metal layer for forming a first connection contact onto the upper side of the semiconductor layer sequence, onto the side surfaces of the semiconductor layer sequence and onto the sacrificial layer;
forming a second connection contact through the active layer;
applying a permanent carrier to the upper side of the semiconductor layer sequence;
detaching the growth substrate; and
exposing the metal layer, wherein detaching the growth substrate results in exposing the metal layer.

* * * * *